(12) United States Patent
Wan et al.

(10) Patent No.: US 7,018,856 B2
(45) Date of Patent: Mar. 28, 2006

(54) CALIBRATION STANDARDS FOR DOPANTS/IMPURITIES IN SILICON AND PREPARATION METHOD

(75) Inventors: Chia-Ching Wan, Kaohsiung (TW); Min-Ta Yu, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 203 days.

(21) Appl. No.: 10/768,882

(22) Filed: Jan. 29, 2004

(65) Prior Publication Data

US 2005/0170535 A1 Aug. 4, 2005

(51) Int. Cl.
*H01L 21/66* (2006.01)
*H01L 21/20* (2006.01)
*H01L 21/36* (2006.01)
*H01L 21/44* (2006.01)
*G01R 31/26* (2006.01)

(52) U.S. Cl. .................. 438/14; 438/505; 438/607; 438/934

(58) Field of Classification Search .................. 438/14, 438/505, 607, 934
See application file for complete search history.

(56) References Cited

U.S. PATENT DOCUMENTS 5,242,855 A * 9/1993 Oguro .................. 438/660
5,254,862 A * 10/1993 Kalyankjumar et al. ...... 257/77

\* cited by examiner

Primary Examiner—William M. Brewster
(74) Attorney, Agent, or Firm—Tung & Assoc.

(57) ABSTRACT

A multi-point calibration standards and a method of fabricating calibration standards which are used to quantify the dose or concentration of a dopant or impurity in a silicon matrix. The calibration standards include a set of calibration standard wafers for each dopant or impurity to be quantified. On each calibration standard wafer in the set is provided a silicon matrix incorporated with one of various concentrations, by weight, of the dopant or impurity in the silicon. The atomic concentration of the dopant or impurity in the silicon on each wafer in the set is measured. A calibration curve is then prepared in which the silicon/dopant or silicon/impurity ratio on each calibration standard wafer in the set is plotted versus the atomic concentration of the dopant or impurity in the silicon on the wafer.

20 Claims, 3 Drawing Sheets

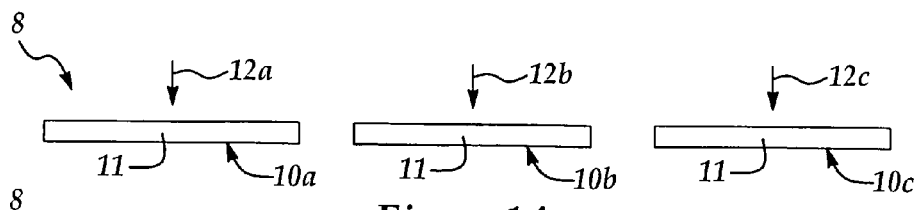
*Figure 1A*
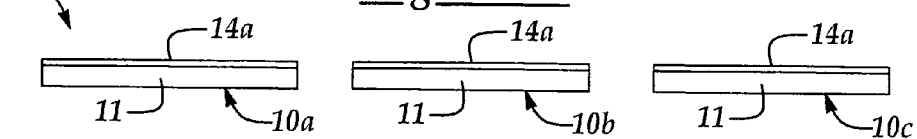
*Figure 1B*
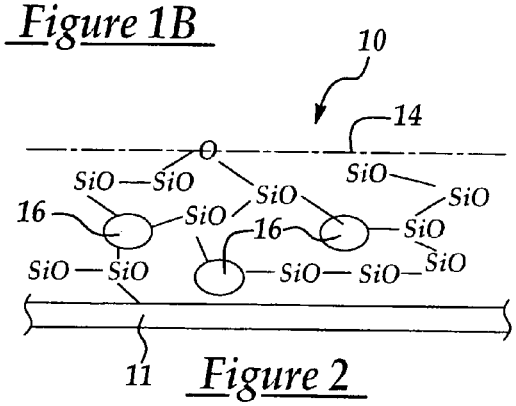
*Figure 2*
- S1 PROVIDE LIQUID SILOXANE
- S2 ADD ELEMENT TO SILOXANE
- S3 COAT SILOXANE ON WAFER
- S4 BAKE WAFER
- S5 ANALYZE ELEMENT CONCENTRATION IN SILICON
- S6 PREPARE CALIBRATION CURVE
*Figure 3*
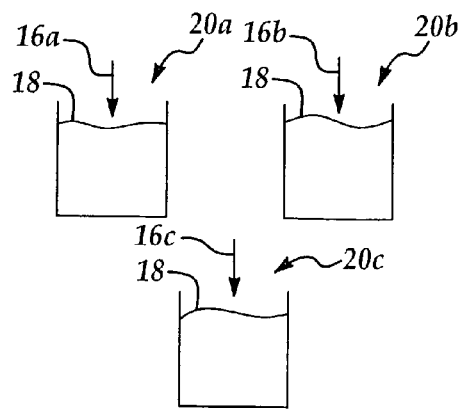
*Figure 4*

CALIBRATION STANDARDS FOR DOPANTS/IMPURITIES IN SILICON AND PREPARATION METHOD

FIELD OF THE INVENTION

The present invention relates to dopant substances used to modify the electrical characteristics of silicon in the fabrication of semiconductor integrated circuits. More particularly, the present invention relates to novel calibration standards and a method for preparing calibration standards used to quantify the concentration of dopants or impurities in silicon.

BACKGROUND OF THE INVENTION

In the semiconductor production industry, various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

Ion implantation is another processing step commonly used in the fabrication of the integrated circuits on the wafer. Ion implantation is a form of doping, in which a substance is embedded into the crystal structure of the semiconductor substrate to modify the electronic properties of the substrate. Ion implantation is a physical process which involves driving high-energy ions into the substrate using a high-voltage ion bombardment. The process usually follows the photolithography step in the fabrication of the circuits on the wafer.

The ion implantation process is carried out in an ion implanter, which generates positively-charged dopant ions in a source material. A mass analyzer separates the ions from the source material to form a beam of the dopant ions, which is accelerated to a high velocity by a voltage field. The kinetic energy attained by the accelerated ions enables the ions to collide with and become embedded in the silicon crystal structure of the substrate. Finally, the doped silicon substrate is subjected to a thermal anneal step to activate the dopant ions.

A phenomenon which commonly results from the ion implantation process is wafer charging, in which positive ions from the ion beam strike the wafer and accumulate in the masking layer. This can cause an excessive charge buildup on the wafer, leading to charge imbalances in the ion beam and beam blow-up, which results in substantial variations in ion distribution across the wafer. The excessive charge buildup can also damage surface oxides, including gate oxides, leading to device reliability problems, as well as cause electrical breakdown of insulating layers within the wafer and poor device yield.

Wafer charging is controlled using a plasma flood system, in which the wafer is subjected to a stable, high-density plasma environment. Low-energy electrons are extracted from an argon or xenon plasma in an arc chamber and introduced into the ion beam, which carries the electrons to the wafer so that positive surface charges on the wafer are neutralized. The energy of the electrons is sufficiently low to prevent negative charging of the wafer.

The performance of semiconductor devices is affected by the distribution of dopant atoms in silicon in regions such as pn junctions, epilayers, and the doping of polysilicon. Typically, semiconductor fabrication processes utilize dopant concentrations which range from about $10^{10}$ atoms/cm$^2$ to about $10^{18}$ atoms/cm$^2$. Various techniques have been devised for determining the dopant concentration, or dose, in silicon. These include an in-line four-point probe method, which is typically used to measure high dopant concentrations. The thermal wave system is another in-line system and is used to measure low dopant concentrations. Secondary-ion mass spectrometry (SIMS) has recently been developed for off-line measurements of dopant concentration. Other tests commonly used to determine dopant concentration in silicon include the sheet resistance test and the capacitance-voltage (C-V) test.

The sheet resistance test, capacitance-voltage test and thermal wave test each utilizes indirect techniques to measure the concentration of dopant in silicon. Consequently, the analytical accuracy of these methods is significantly affected by both the presence of other ions in the crystalline silicon matrix and the various annealing conditions used in the ion implantation process. Establishing the accuracy of the dopant concentration in silicon using conventional methods is difficult, due mainly to the silicon matrix effect on the yield of ions obtained by the ion bombardment of the ion implantation process.

Currently, no method is available to accurately quantify the concentration of dopant ions implanted in silicon on a wafer. Accordingly, calibration standards are needed for accurately quantifying the concentration of dopant atoms or impurities implanted in silicon in order to control the ion implantation dopant dose and impurity concentration in the silicon.

An object of the present invention is to provide novel calibration standards for quantifying the total concentration or dose of a dopant or impurity for ion implantation in a silicon matrix.

Another object of the present invention is to provide novel calibration standards for accurately quantifying the concentration of a dopant or impurity in a silicon matrix.

Still another object of the present invention is to provide novel calibration standards which utilize standard samples of known dopant or impurity concentrations to plot a calibration curve that is used to quantify various concentrations of a dopant or impurity in silicon.

Yet another object of the present invention is to provide novel, multi-point calibration standards which are useful in accurately and precisely quantifying dopant and impurity concentrations in a silicon matrix in order to control the dose quantity and impurity concentration in the silicon.

Still another object of the present invention is to provide a method for preparing novel calibration standards, according to which method a dopant or impurity is incorporated at various dopant/silicon or impurity/silicon atomic ratios into respective silicon matrices on multiple calibration standard wafers of a set of wafers; the atomic concentrations of the dopant or impurity in the silicon matrices are determined; and a calibration curve is formulated in which the ratio of the dopant or impurity atoms to silicon atoms in each silicon matrix is plotted versus the atomic concentration of the dopant or impurity in that silicon matrix, such that the atomic concentration of the dopant or impurity in a silicon matrix on actual wafers can be determined based on the dopant/silicon or impurity/silicon ratio in the silicon matrix.

SUMMARY OF THE INVENTION

In accordance with these and other objects and advantages, the present invention is generally directed to novel, multi-point calibration standards which are used to quantify the dose or concentration of a dopant or impurity in a silicon matrix. The calibration standards include a set of calibration standard wafers for each dopant or impurity to be quantified. On each calibration standard wafer in the set is provided a silicon matrix incorporated with one of various concentrations, by weight, of the dopant or impurity in the silicon. The dopant or impurity may be boron, arsenic, indium or copper, for example. The atomic concentration of the dopant or impurity in the silicon on each wafer in the set is measured, typically using LA-ICPMS (Laser Ablation-Inductively Coupled Plasma Mass Spectrometry). A calibration curve is then prepared in which the silicon/dopant or silicon/impurity ratio on each calibration standard wafer in the set is plotted versus the atomic concentration of the dopant or impurity in the silicon on the wafer.

Each of the calibration standard wafers of the present invention is prepared by initially mixing a selected quantity of the dopant or impurity with liquid methylsiloxane. The liquid methylsiloxane, containing the dopant or impurity of desired concentration, is then coated on a silicon wafer. The wafer is then baked, typically on a hot plate, to drive off water and methyl hydroxide and solidify the silicon matrix, incorporated with the dopant or impurity, on the wafer. The atomic concentration of the dopant or impurity in the silicon matrix is then analyzed typically using LA-ICPMS (Laser Ablation-Inductively Coupled Plasma Mass Spectrometry). Finally, the calibration curve for the dopant or impurity is prepared by plotting the dopant/silicon or impurity/silicon ratio in the silicon matrix versus the atomic concentration of the dopant or impurity in the matrix, as determined by LA-ICPMS.

The present invention is further directed to a novel method for preparing calibration standards which are useful in quantifying the atomic concentration of a dopant or impurity in silicon. The method includes providing separate batches of liquid methylsiloxane, mixing various quantities of the dopant or impurity with the methylsiloxane batches, coating the resulting batch mixtures on respective calibration standard wafers in a set, heating the calibration standard wafers to solidify the liquid batch mixtures into a silicon matrix of corresponding dopant/silicon or impurity/silicon atomic ratio on the wafers, determining the atomic concentration of the dopant or impurity in the silicon matrix on each of the wafers, and preparing a calibration curve with the dopant/silicon or impurity/silicon atomic ratio plotted versus the atomic concentration of the dopant or impurity in the silicon matrix for each calibration standard wafer in the set.

BRIEF DESCRIPTION OF THE DRAWINGS

The invention will now be described, by way of example, with reference to the accompanying drawings, in which:

FIG. 1A is a side view of a set of three calibration standard wafers, illustrating coating of liquid methylsiloxane on each wafer;

FIG. 1B is a side view of the calibration standard wafers of FIG. 1A, with a silicon matrix on each wafer;

FIG. 2 is a schematic illustrating a silicon matrix incorporated with a dopant or impurity and provided on a calibration standard wafer;

FIG. 3 is a flow diagram illustrating a typical sequence of process steps according to the calibration standard preparation method of the present invention;

FIG. 4 is a side view of multiple batches of liquid methylsiloxane provided in separate containers;

DETAILED DESCRIPTION OF THE INVENTION

Figure 5:
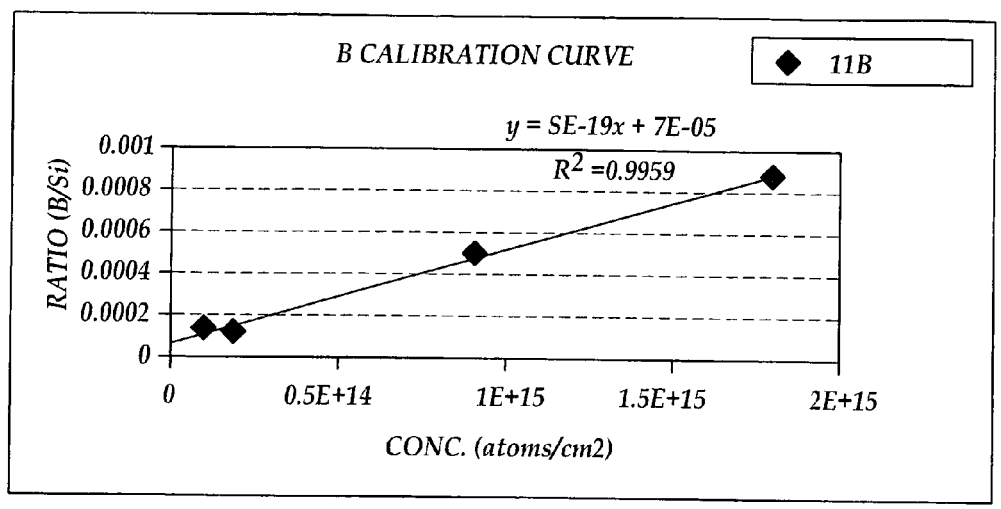
FIG. 5 is a calibration curve with various boron/silicon ratios plotted against various atomic concentrations of boron in silicon matrices on a set of multiple calibration standard wafers.

The present invention includes novel, multi-point calibration standards and a method for preparing calibration standards which are useful to quantify the dose or concentration of a dopant or impurity in a silicon matrix. The calibration standards include a set of calibration standard wafers for each of the dopants or impurities to be quantified. Each calibration standard wafer in a set is prepared by mixing a selected quantity of the dopant or impurity with liquid methylsiloxane to form a liquid siloxane mixture; coating the liquid methylsiloxane mixture on a silicon wafer; and baking the wafer to solidify the silicon matrix, incorporated with the dopant or impurity, on the wafer. The calibration standard wafers in a set vary from each other according to the quantity of the dopant or impurity, or the dopant/silicon or impurity/silicon atomic ratio, in the silicon matrix. The atomic concentration of the dopant or impurity in the silicon matrix of each wafer in the set is then analyzed, typically using LA-ICPMS (Laser Ablation-Inductively Coupled Plasma Mass Spectrometry). Finally, the calibration curve for the dopant or impurity is prepared by plotting the dopant/silicon or impurity/silicon ratios against the corresponding atomic concentrations of the dopant or impurity in the silicon matrices on the respective calibration standard wafers in the set.

Referring initially to FIG. 2, a calibration standard wafer 10 prepared according to the present invention includes a typically silicon substrate 11. A silicon matrix 14, incorporated with a selected quantity of a dopant or impurity 16, is formed on the substrate 11. The dopant/impurity 16 crosslinks the silicon oxide in the silicon matrix 14. As hereinafter further described, the calibration standard wafer 10 is typically one of at least three calibration standard wafers 10 that form a wafer set. Each wafer 10 differs from the others in the same wafer set by the quantity of dopant/impurity 16 incorporated in the silicon matrix 14.

The dopant/impurity 16 may be any dopant material which is useful in modifying the electrical characteristics of silicon in semiconductor fabrication technology, including but not limited to boron, indium, arsenic and copper. In subsequent processing steps, the atomic concentration of the dopant/impurity 16 on each wafer 10 is quantified. A calibration curve (not shown) is then prepared by plotting the atomic concentrations of the dopant/impurity 16 versus the atomic ratios of dopant/impurity 16 to silicon in the matrices 14 on the respective wafers 10 in the wafer set, as hereinafter described. Accordingly, by use of the calibration curve, the atomic concentration of the dopant or impurity in a silicon matrix on actual semiconductor wafer substrates can be precisely determined based on the dopant/silicon or impurity/silicon atomic ratio in the silicon matrix.

Referring to FIGS. 1A, 1B and 4, the calibration standards for each dopant or impurity to be quantified in accordance with the present invention include a set 8 of at least three calibration standard wafers 10a, 10b, 10c, as shown in FIGS. 1A and 1B. As shown in FIG. 4, three separate batches 20a, 20b, 20c of liquid methylsiloxane 18 are initially provided. A selected quantity 16a, 16b, 16c of the dopant/impurity is then added to and mixed with each of the respective batches 20a, 20b, 20c to form a methylsiloxane mixture 12a, 12b, 12c (FIG. 1A) that will be coated on each wafer 10a, 10b, 10c.

The atomic ratio of the dopant/impurity 16 to silicon varies among the methylsiloxane mixtures 12a, 12b, 12c. For example, if the dopant/impurity 16 is boron, the boron:silicon atomic ratio is typically lowest (such as 0.0002, for example) in the first methylsiloxane mixture 12a. The boron:silicon atomic ratio is highest (such as 0.0008, for example) in the third methylsiloxane mixture 12c, and is intermediate (such as 0.006), for example) in the second methylsiloxane mixture 12b. On a calibration curve, these boron/silicon ratio values are ultimately plotted versus the atomic concentrations of boron in respective silicon matrices 14a, 14b, 14c formed on the calibration standard wafers 10a, 10b, 10c by solidification of the boron-containing methylsiloxane mixtures 12a, 12b, 12c, respectively, shown in FIG. 1B and hereinafter further described.

After the methylsiloxane mixtures 12a, 12b, 12c are prepared with various quantities 16a, 16b, 16c of the dopant/impurity, as shown in FIG. 4, the first methylsiloxane mixture 12a is coated on the first calibration standard wafer 10a; the second mixture 12b is coated on the second wafer 10b; and the third mixture 12c is coated on the third wafer 10c, as shown in FIG. 1A. Next, the wafers 10a, 10b, 10c are baked, typically using a hot plate (not shown). This converts the liquid methylsiloxane mixtures 12a, 12b, 12c into solid silicon oxide which is cross-linked with the dopant/impurity 16, as shown in FIG. 2, forming a silicon matrix 14a, 14b, 14c on the respective wafers 10a, 10b, 10c, as shown in FIG. 1B. Because it is highly diffusive in the liquid methylsiloxane 18, the dopant/impurity has a uniform concentration throughout the silicon matrix.

After the silicon matrices 14a, 14b, 14c are formed on the respective wafers 10a, 10b, 10c, as heretofore described, the atomic concentration of the dopant/impurity 16a, 16b, 16c in each silicon matrix 14a, 14b, 14c is determined. This is accomplished typically using LA-ICPMS (Laser Ablation-Inductively Coupled Plasma Mass Spectrometry). In LA-ICPMS, a laser beam (not shown) is used to ablate a portion of the silicon matrix 14a, 14b, 14c to reveal the atomic concentration of the dopant/impurity 16a, 16b, 16c in each silicon matrix 14a, 14b, 14c. The dopant/impurity:silicon atomic ratio, versus the atomic concentration of the dopant/impurity, in each silicon matrix 14a, 14b, 14c is then plotted on a calibration curve, hereinafter further described.

Referring next to FIG. 3, a typical flow of process steps in fabrication of the silicon matrix on each calibration standard wafer, is summarized. First, a batch of liquid methylsiloxane is provided, as indicated in step S1. Next, the selected concentration of the dopant/impurity element is added to and mixed with the liquid methylsiloxane, as indicated in step S2, to form a methylsiloxane mixture, as indicated in step S3. The wafer is then baked, as indicated in step S4, to solidify the siloxane into a silicon matrix cross-linked with the dopant/impurity atoms. Next, as indicated in step S5, the atomic concentration of the dopant/impurity is analyzed typically using LA-ICPMS (Laser Ablation-Inductively Coupled Plasma Mass Spectrometry). Finally, as indicated in step S6, the dopant/impurity:silicon atomic ratio versus the dopant/impurity atomic concentration is plotted on a calibration curve.

Referring next to FIG. 5, a calibration curve 24 prepared according to the method of the present invention is shown. In the calibration curve 24, boron (11) is the dopant/impurity incorporated into the silicon matrix on each of multiple calibration standard wafers in a set. The boron:silicon atomic ratio (on the Y-axis) versus the atomic concentration (atoms/cm$^2$) of boron (on the X-axis) in the silicon matrix on the respective calibration standard wafers in a wafer set, is plotted on the calibration curve 24. The values for the boron:silicon ratio range from 0 to 0.001, whereas the values for the boron atomic concentration range from 0 to $2.0 \times 10^{15}$. These values were subjected to linear regression with $R^2 = 0.9959$.

In application, the calibration curve 24 is used to determine the boron:silicon atomic ratio necessary to achieve a particular atomic concentration of boron in the doping of a layer on an actual wafer substrate in semiconductor fabrication. For example, according to the calibration curve 24, for an atomic boron concentration of $0.5 \times 10^{14}$, it is necessary to use a boron:silicon atomic ratio of 0.0003. The boron can then be incorporated into the silicon at that boron:silicon ratio to achieve the desired atomic boron concentration of $0.5 \times 10^{14}$.

Figure 6:
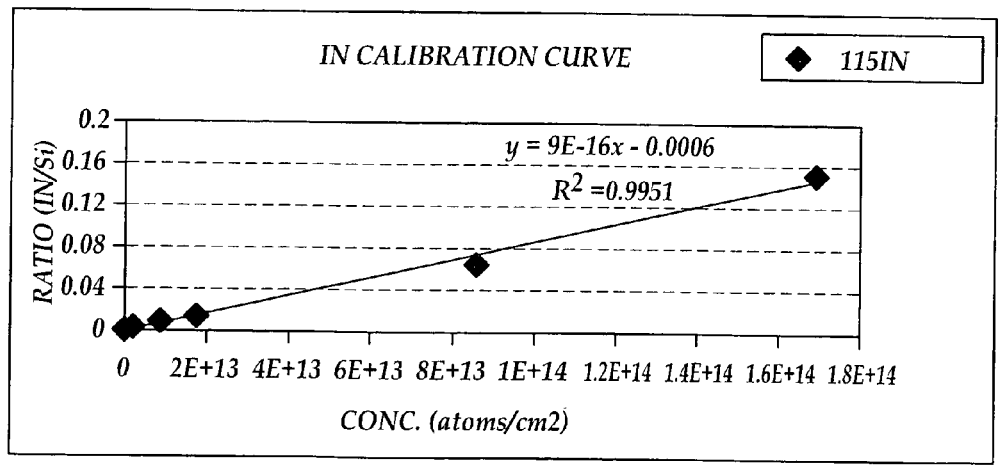
FIG. 6 is a calibration curve with various indium/silicon ratios plotted against various atomic concentrations of indium in silicon matrices on a set of multiple calibration standard wafers.

Referring next to FIG. 6, a calibration curve 26 prepared according to the method of the present invention is shown in which indium (115) is the dopant/impurity incorporated into the silicon matrix on each of multiple calibration standard wafers in a set. The values for the indium:silicon ratio range from 0 to 0.2, whereas the values for the indium atomic concentration range from 0 to $1.8 \times 10^{14}$. These values were subjected to linear regression with $R^2 = 0.9951$.

Figure 7:
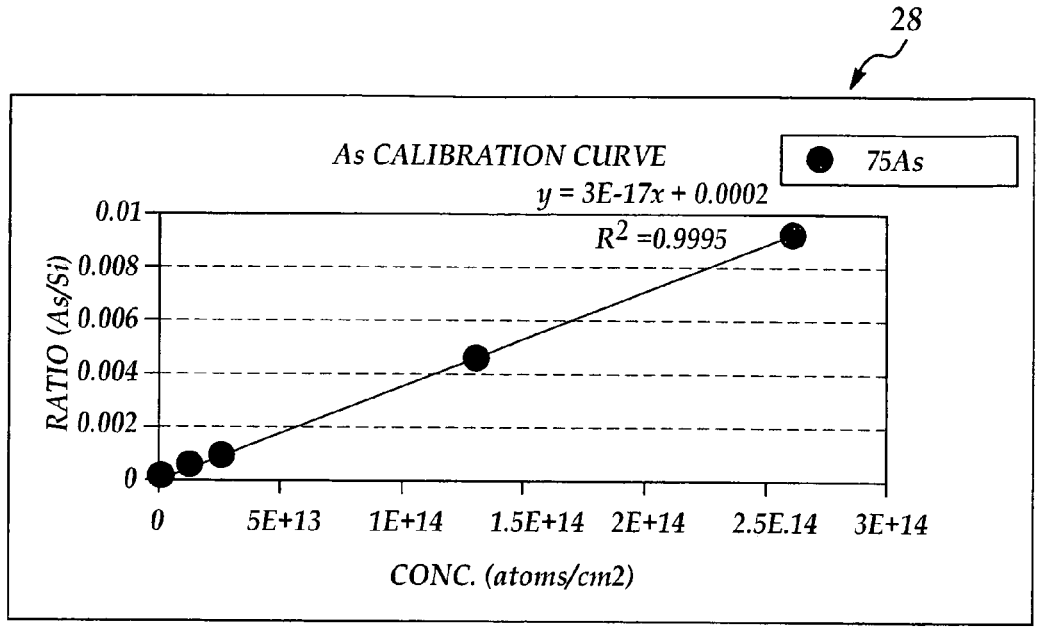
FIG. 7 is a calibration curve with various arsenic/silicon ratios plotted against various atomic concentrations of arsenic in silicon matrices on a set of multiple calibration standard wafers.

Referring next to FIG. 7, a calibration curve 28 prepared according to the method of the present invention is shown in which arsenic (75) is the dopant/impurity incorporated into the silicon matrix on each of multiple calibration standard wafers in a set. The values for the arsenic:silicon ratio range from 0 to 0.01, whereas the values for the arsenic atomic concentration range from 0 to $3.0 \times 10^{14}$. These values were subjected to linear regression with $R^2 = 0.9995$.

Figure 8:
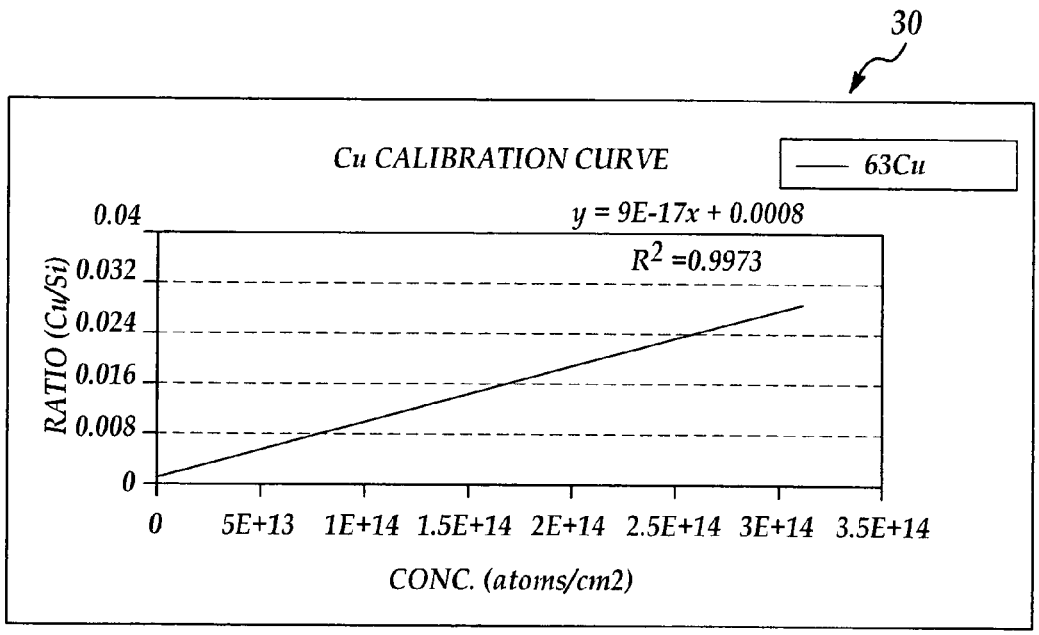
FIG. 8 is a calibration curve with various copper/silicon ratios plotted against various atomic concentrations of copper in silicon matrices on a set of multiple calibration standard wafers.

Referring next to FIG. 8, a calibration curve 30 prepared according to the method of the present invention is shown in which copper (63) is the dopant/impurity incorporated into the silicon matrix on each of multiple calibration standard wafers in a set. The values for the copper:silicon ratio range from 0 to 0.04, whereas the values for the indium atomic concentration range from 0 to $3.5 \times 10^{14}$. These values were subjected to linear regression with $R^2 = 0.9973$.

While the preferred embodiments of the invention have been described above, it will be recognized and understood that various modifications can be made in the invention and the appended claims are intended to cover all such modifications which may fall within the spirit and scope of the invention.

What is claimed is:

1. A calibration standard prepared by:
   providing a substrate;

forming a silicon matrix on said substrate, said silicon matrix having an element in a selected element:silicon atomic ratio;

determining an atomic concentration of said element in said silicon matrix; and formulating a calibration curve by plotting said atomic ratio versus said atomic concentration of said element in said silicon matrix.

2. The calibration standard of claim 1 wherein said substrate comprises a silicon wafer substrate.

3. The calibration standard of claim 1 wherein said element is an element selected from the group consisting of boron, indium, arsenic and copper.

4. The calibration standard of claim 3 wherein said substrate comprises a silicon wafer substrate.

5. The calibration standard of claim 1 wherein said determining an atomic concentration of said element in said silicon matrix comprises determining an atomic concentration of said element in said silicon matrix using laser ablation-inductively coupled plasma mass spectrometry.

6. The calibration standard of claim 5 wherein said substrate comprises a silicon wafer substrate.

7. The calibration standard of claim 5 wherein said element is an element selected from the group consisting of boron, indium, arsenic and copper.

8. The calibration standard of claim 7 wherein said substrate comprises a silicon wafer substrate.

9. A calibration standard prepared by:

providing a substrate;

forming a silicon matrix on said substrate by providing methylsiloxane and an element, mixing said element with said methylsiloxane in a selected element:silicon atomic ratio, coating said methylsiloxane on said substrate and baking said substrate;

determining an atomic concentration of said element in said silicon matrix; and formulating a calibration curve by plotting said atomic ratio versus said atomic concentration of said element in said silicon matrix.

10. The calibration standard of claim 9 wherein said substrate comprises a silicon wafer substrate.

11. The calibration standard of claim 9 wherein said element is an element selected from the group consisting of boron, indium, arsenic and copper.

12. The calibration standard of claim 11 wherein said substrate comprises a silicon wafer substrate.

13. The calibration standard of claim 9 wherein said determining an atomic concentration of said element in said silicon matrix comprises determining an atomic concentration of said element in said silicon matrix using laser ablation-inductively coupled plasma mass spectrometry.

14. The calibration standard of claim 13 wherein said substrate comprises a silicon wafer substrate.

15. The calibration standard of claim 13 wherein said element is an element selected from the group consisting of boron, indium, arsenic and copper.

16. The calibration standard of claim 15 wherein said substrate comprises a silicon wafer substrate.

17. A method of preparing a calibration standard, comprising the steps of:

providing a substrate;

forming a silicon matrix having an element in a selected element:silicon atomic ratio on said substrate;

determining an atomic concentration of said element in said silicon matrix; and formulating a calibration curve by plotting said atomic ratio versus said atomic concentration of said element in said silicon matrix.

18. The method of claim 17 wherein said element is an element selected from the group consisting of boron, indium, arsenic and copper.

19. The method of claim 17 wherein said determining an atomic concentration of said element in said silicon matrix comprises determining an atomic concentration of said element in said silicon matrix using laser ablation-inductively coupled plasma mass spectrometry.

20. The method of claim 17 wherein said forming a silicon matrix having an element in a selected element:silicon atomic ratio on said substrate comprises providing methylsiloxane and said element, mixing said element with said methylsiloxane in a selected element:silicon atomic ratio, coating said methylsiloxane on said substrate and baking said substrate.

* * * * *